United States Patent
Hillmer et al.

(10) Patent No.: US 7,054,340 B1
(45) Date of Patent: May 30, 2006

(54) METHOD AND DEIVCE FOR TUNING THE WAVELENGTH OF AN OPTOELECTRONIC COMPONENT ARRANGEMENT

(75) Inventors: Hartmut Hillmer, Kassel (DE); Bernd Klepser, Meiningen (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/555,662

(22) PCT Filed: Oct. 21, 1998

(86) PCT No.: PCT/EP98/06911

§ 371 (c)(1),
(2), (4) Date: Aug. 25, 2000

(87) PCT Pub. No.: WO99/28998

PCT Pub. Date: Jun. 10, 1999

(30) Foreign Application Priority Data

Dec. 1, 1997  (DE) ................. 197 55 457

(51) Int. Cl.
*H01S 3/10* (2006.01)

(52) U.S. Cl. .............. 372/20; 372/22; 372/34; 372/36; 359/330

(58) Field of Classification Search .......... 372/20, 372/29.02, 32, 34, 33, 38.1, 22; 359/330
See application file for complete search history.

(56) References Cited

U.S. PATENT DOCUMENTS

| | | | | |
|---|---|---|---|---|
| 5,140,605 A | * | 8/1992 | Paoli et al. | 372/50 |
| 5,325,229 A | * | 6/1994 | Millard | 359/330 |
| 5,341,391 A | * | 8/1994 | Ishimura | 372/46 |
| 5,373,515 A | * | 12/1994 | Wakabayashi et al. | 372/20 |
| 5,473,625 A | * | 12/1995 | Hansen et al. | 372/96 |
| 5,536,085 A | * | 7/1996 | Li et al. | 372/50 |
| 5,544,268 A | * | 8/1996 | Bischel et al. | 385/4 |

FOREIGN PATENT DOCUMENTS

| | | | |
|---|---|---|---|
| JP | 01251686 A | * | 10/1989 |
| JP | 06097602 A | * | 4/1994 |
| JP | 59204292 A | * | 11/1994 |

OTHER PUBLICATIONS

Seto Kaoru, Laser Emitting Device, Mar. 30, 1988, Patent Abstract of Japan, Canon Inc.
Hazemoto Yoshiki, Semiconductor Device, May 6, 1983, Patent Abstract of Japan, Canon Inc.

* cited by examiner

*Primary Examiner*—Minsun O Harvey
*Assistant Examiner*—Dung Nguyen
(74) *Attorney, Agent, or Firm*—Kenyon & Kenyon

(57) ABSTRACT

A method and device for tuning the wavelength of an optoelectronic component arrangement including at least two optoelectronic components. The characteristic wavelength for each optoelectronic component is adjusted using a respective resistance device which is connected between a common voltage/power source and a respective heating device associated with each optoelectronic component. Heating capacity is modified by changing the overall resistance of the respective resistance device (RM) in order to adjust wavelength. The wavelength of semiconductor lasers, filters, wavelength multiplexers and waveguides may be tuned.

19 Claims, 20 Drawing Sheets

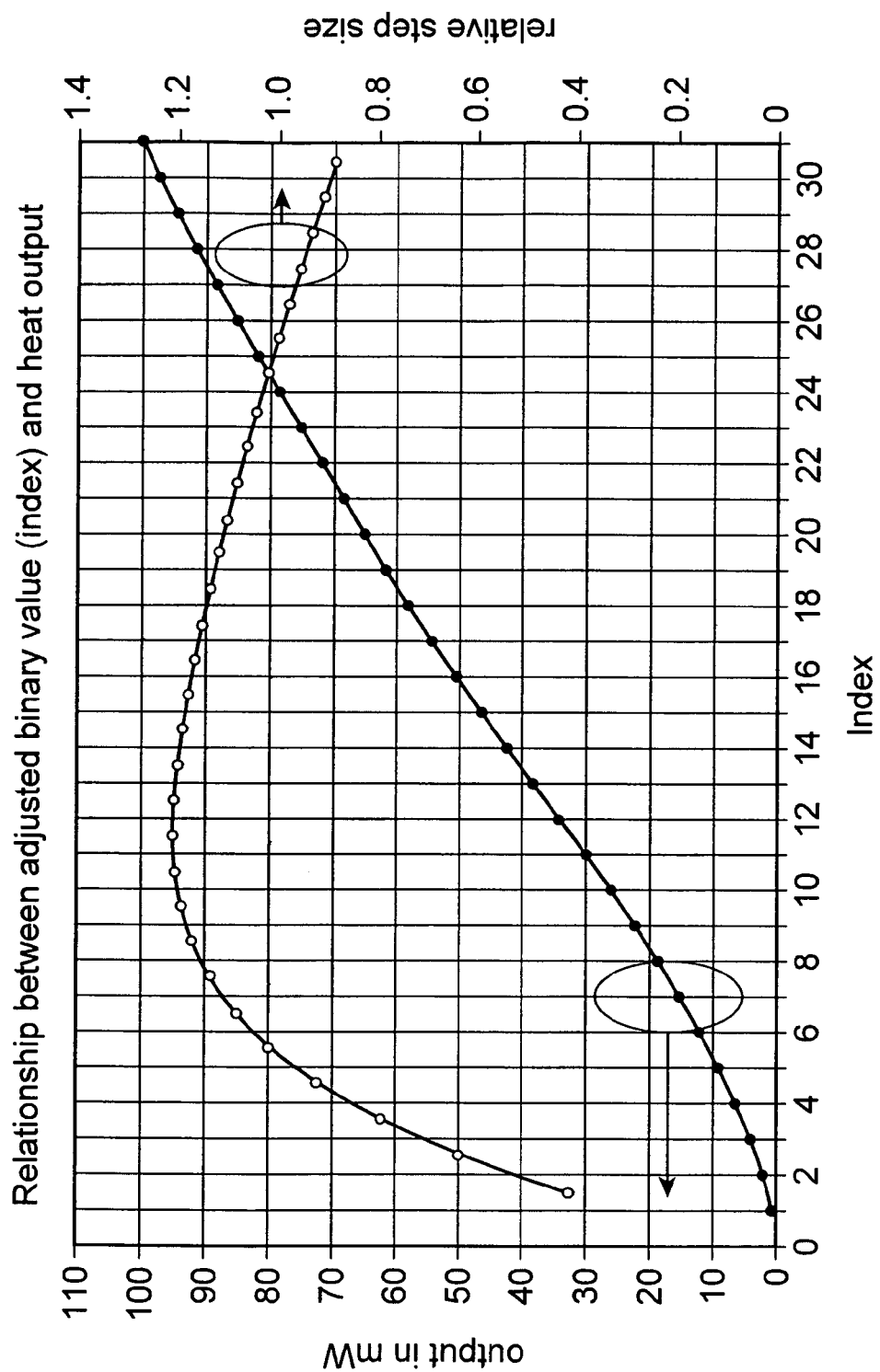

METHOD AND DEIVCE FOR TUNING THE WAVELENGTH OF AN OPTOELECTRONIC COMPONENT ARRANGEMENT

FIELD OF THE INVENTION

The present invention relates to a method for tuning the wavelengths of optoelectronic components in an optoelectronic component array.

The present invention also relates to an optoelectronic component array having at least two optoelectronic components where each individual optoelectronic component of the component array has an associated resistance heater for setting the characteristic wavelength of the optoelectronic component.

RELATED TECHNOLOGY

Optical transmission systems are being increasingly used for the transmission of data and for the transmission of television and radio channels. Generally, such optical transmission systems include a light-conducting waveguide, and a solid-state laser as a light generator and a light detector. The solid-state laser emits light of a defined, characteristic wavelength. This characteristic wavelength is essentially dependent on the material used, but it can be set within a defined wavelength range, for example, by the action of heat. To increase the volume of data that can be transmitted through a waveguide, it is possible to employ a plurality of solid-state lasers associated with a waveguide, the solid-state lasers operating with different wavelengths. In this connection, however, precise adherence to the wavelengths is needed, making it possible for the data to be differentiated unambiguously at the end of the transmission.

Since, for reasons inherent to the manufacturing process, the characteristic wavelengths of solid-state lasers vary within a tolerance range, it is necessary for the solid-state lasers to be tuned before they are used for the transmission of data. So-called resistance heaters, for example, are used for this purpose, the resistance heaters changing the characteristic wavelength of a solid-state laser through the action of heat. Generally, tuning is accomplished by adjusting the voltage applied to the resistance heater, a separate voltage source being associated with each resistance heater and, thus, with each optoelectronic component of the component arrangement.

However, this entails the disadvantage that a very complex design is required. Furthermore, later tuning of the arrangement is not easily possible.

SUMMARY OF THE INVENTION

An object of the present invention, therefore, is to provide a method and device for tuning optoelectronic components, the method and device being simple and able to be implemented at low cost.

The method and device according to the present invention the principle of thermally changing the resistance heaters of the optoelectronic components of the optoelectronic component array in question.

In the method according to the present invention wavelength is measured for each optoelectronic component of the optoelectronic component array. On the basis of a comparison of the measured wavelength with the desired characteristic wavelength, the deviation from the desired characteristic wavelength is determined for each optoelectronic component of the optoelectronic component array. Next, according to the present invention, a resistor arrangement associated with the respective optoelectronic component is modified as a function of the ascertained wavelength deviation. By way of its total resistance, the resistor arrangement, which is connected upstream of the heater of the optoelectronic component, influences the heating power of the heater of the optoelectronic component. The total resistance of the resistor arrangement is set such that, by way of the heating power, the desired characteristic wavelength of the optoelectronic component in question is obtained. This procedure is carried out on an individual basis for each optoelectronic component of the optoelectronic component array. The method according to the present invention permits the very simple setting of the optoelectronic components of a component array, such as a row of solid-state lasers. In particular, the method can be performed fully automatically, which is a significant advantage when optoelectronic components are used on a large scale.

The present invention provides for its component array to include resistor arrangements RM, in addition to a common voltage source $U_0$. Each optoelectronic component of the component array is associated with a separate resistor arrangement RM. The resistor arrangement RM is disposed between common voltage source $U_0$ and resistance heater H; i.e., a separate resistor arrangement RM is connected upstream from each resistance heater H. Each resistor arrangement RM is composed of a network of resistors R. Consequently, the heating power for each optoelectronic component of the optoelectronic component array can be set easily by making corresponding changes to the resistor network. Since all resistor arrangements RM are supplied by a single voltage source $U_0$, the need is eliminated for a substantial amount of circuitry, resulting in cost savings. A further advantage is that the characteristic wavelengths of the optoelectronic components can also be subsequently tuned in a simple manner by changing the total resistance and, thus, the heating power.

An embodiment of the present invention provides for configuring resistor arrangement RM in the form of a resistor array, which includes a plurality of resistor elements arranged systematically according to resistance values. Preferably, resistor arrangement RM includes one or more rows of contact fields K, the resistors of resistor arrangement RM being disposed between individual contact fields K. The total resistance of resistor arrangement RM and, thus, the heating power of the heater of the optoelectronic component can be altered by switching or bypassing contact fields K. Since contact fields K and the resistors are arranged according to logical aspects, the heating power can be simply set by the manner in which contact fields K are interconnected, it being possible to determine the specifically required connections from the systematic nature of the matrix. At the same time, the method according to the present invention also makes it possible to adapt the heating power, at any time, as needed.

BRIEF DESCRIPTION OF THE DRAWINGS

The present invention is explained in greater detail below with reference to the drawings, in which:

FIGS. 4b to 4d show three graphs for determining the heating power;

FIG. 13b shows a circuit diagram representing the component array of FIG. 13a.

DETAILED DESCRIPTION

Figure 1:
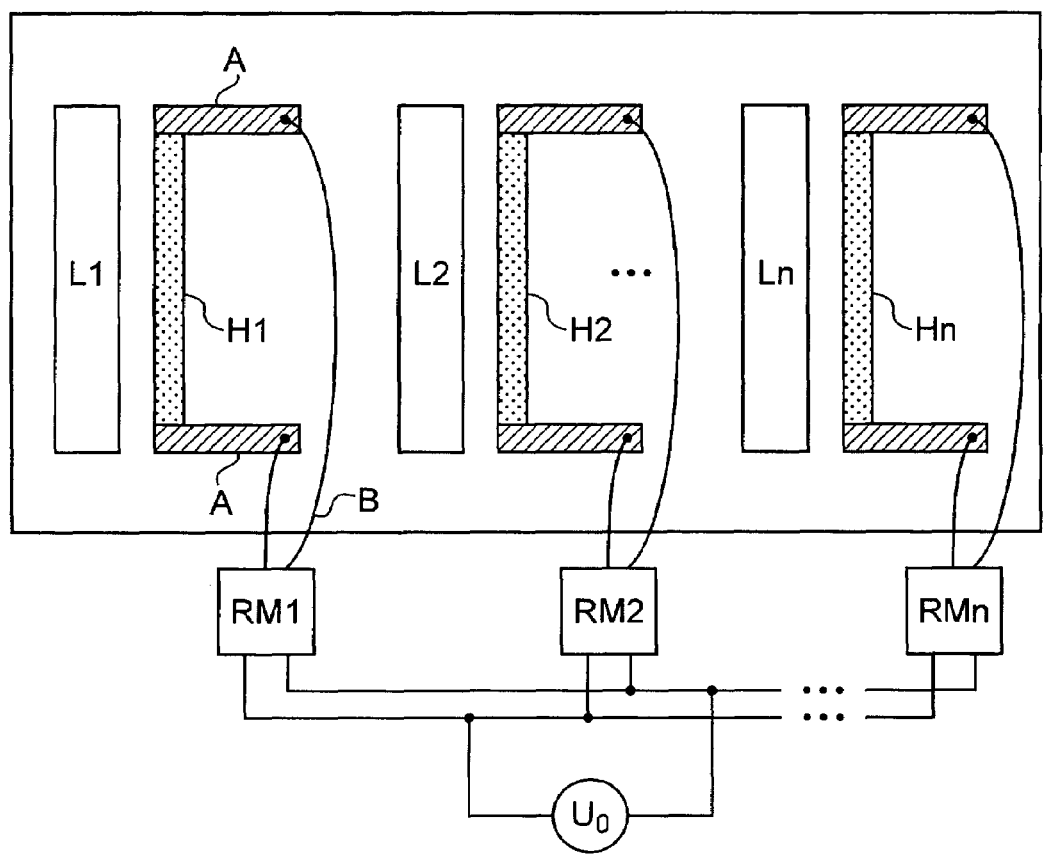
FIG. 1 shows a block diagram of an optoelectronic component array.

FIG. 1 shows a component array 1 including a number of solid-state lasers L1 to Ln. The basic construction of such a row of solid-state lasers is generally known, so that it is not precisely described here. To simultaneously transmit data in an optical data transmission system, solid-state lasers L1–Ln operate with different wavelengths or frequencies. For reasons inherent to the manufacturing process, solid-state lasers L1–Ln do not always emit radiation of the desired wavelength. For that reason, prior to and/or during initial operation, they are tuned to the desired wavelength by changing the characteristic wavelength, the thermal effect being exploited in the present case. By individually subjecting solid-state lasers L1–Ln to a suitable, defined temperature, it is possible to vary the respective wavelength within a defined range.

For this purpose, each solid-state laser L1 to Ln is associated with at least one resistance heater H1 to Hn. Each of resistance heaters H1 to Hn is made up of a current conductor, which has a suitably high resistance and generates heat when a voltage is applied, and produces a temperature field in the respective solid-state laser L1–Ln. To produce the desired temperature field, it is necessary in many cases for the heating power to first be adjusted. To this end, each resistance heater H1–Hn is connected, according to the present invention, to a separate resistor array RM1–RMn. All resistor arrangements RM1–RMn are connected to a common voltage source $U_0$ and are supplied by it. Resistor arrangements RM1–RMn may be in the form of resistor arrays composed of individual resistors. By selectively manipulating the individual resistors, one selectively changes the total resistance of the resistor arrangement, configured as a resistor array. Changing the total resistance of the individual resistor arrangements RM1–RMn effects a change in the current flowing through resistance heaters H1–Hn and, therefore, in the heating power of individual resistance heaters H1–Hn. The wavelength is altered on an individual basis by varying the heating power of individual resistance heaters H1–Hn until the desired characteristic wavelength is set for each individual solid-state laser L1–Ln. The resistors of resistor arrangements RM1–RMn are set to defined resistance values electrically, optically and/or by electromagnetic waves. Resistor arrangements RM1–RMn can, on the one hand, be disposed on a substrate/insulator carrying solid-state lasers L1–Ln. Resistor arrangements RM1–RMn can also be disposed separately from solid-state lasers L1–Ln, for example at a later, easily accessible location of the entire data transmission unit.

Figure 2A:
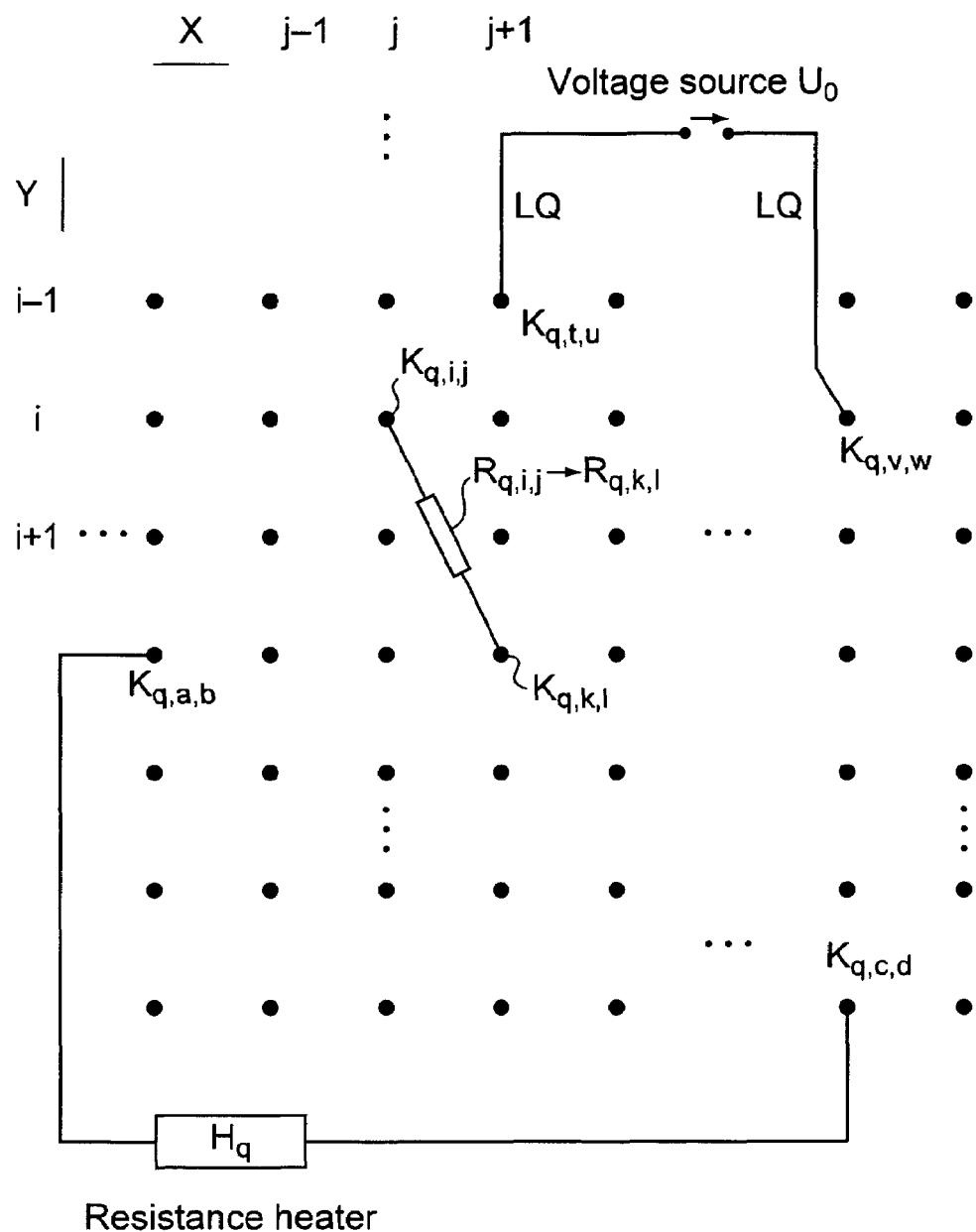
FIG. 2a shows a schematic representation of a resistor apparatus.

As already mentioned, characteristic wavelength $\lambda_q$ of each individual optoelectronic component, such as of solid-state lasers L1–Ln, can be individually set by varying the temperature of each individual solid-state laser L1–Ln and, therefore, by way of heating power $P_q$, or heating current $I_q$, through resistance heaters H1–Hn. The basis for individually setting the heating current for each channel q, with $q \in [1-n]$ is provided by the matrix-like arrangement of resistor arrangements RM1–RMn. FIG. 2a shows such a resistor arrangement for channel q. The resistor arrangement includes contact fields $K_{q,i,j}$ having coordinates (i,j), where $i \in [1, r]$ and $j \in [1, s]$, q indicate the component number (channel) and r and s, respectively, denote the size of the matrix-like resistor arrangement in the y and x directions. Plotted indices j and i denote the column and row numbers. This matrix-like arrangement of contact fields is also referred to in the following as a contact matrix. The contact fields are connected by ohmic resistors $R_{q,ij \rightarrow q,k,l}$, where $R_{q,ij \rightarrow q,k,l}$ denotes a resistance between the contact fields $K_{q,ij}$ and $K_{q,k,l}$. The resistance values of the ohmic resistors include values $R_{q,ij \rightarrow q,k,l} = 0$ ohm (short circuit) to $R_{q,ij \rightarrow q,k,l} \rightarrow \infty$ (no electrically conducting connection or insulator). Contact fields $K_{q,t,u}$ and $K_{q,v,w}$, where $(t,u) \neq (v,w)$, are connected to an electrical voltage source $U_0$ which generates a potential difference U(t) of any desired time characteristic, between the contact fields. The electrical connections of voltage source $U_0$ to contact fields $K_{q,t,u}$ and $K_{q,v,w}$ are identified in the following as LQ. An electrical connection LQ is composed of a number $f \geq 1$ of mathematically multiply connected and electrically interconnected, electrically conductive regions. These regions contain a number $g \geq 0$ of electrically conductive regions of resistance heater $H_q$ of a channel q and a number $h \geq 0$ of electrically conductive regions of the matrix-like arrangement of contact fields. Contact fields $K_{q,a,b}$ and $K_{q,k,l}$, where $(a,b) \neq (c,d)$, are connected by an electrically conducting connection to resistance heater $H_q$, in such a way that the potential difference between points $K_{q,a,b}$ and $K_{q,c,d}$ induces electric current to flow through resistance heater $H_q$, if resistance value $R_q$ of resistance heater $H_q$ is finite.

The arrangement, including voltage source $U_0$, electrical connections LQ, the matrix-like arrangement of contact fields, ohmic resistors $R_{q,ij \rightarrow q,k,l}$ between contact fields $K_{q,i,j}$ and $K_{q,k,l}$, is manipulated or tuned according to the present invention in such a way that a heating power $P_q$ automatically adjusts itself at electrical resistance heater $H_q$, giving rise to a temperature change $\Delta T_q$ at solid-state laser $L_q$ due to the thermal coupling of resistance heater $H_q$ to solid-state laser $L_q$. This temperature change causes a wavelength shift $\Delta \lambda_q$ of the characteristic wavelength of channel q. Wavelength $\lambda_q$ of channel q is individually set in accordance with the following method:

At the beginning of the process, a heating power $P_q \geq 0$ is set, the heating power resulting in a wavelength $\lambda_q$. The aim is to set the heating power, such that the wavelength is $\lambda_{q,s}$.

The resistance heater's heating power is varied within a range in which the associated change in wavelength covers the range of desired wavelength $\lambda_{q,s}$. This measurement yields a functional relationship $\lambda_q(P_q)$. Accordingly, it is possible, from the relationship, to determine heating power $P_q$ for a wavelength $\lambda_{q,s}$. The desired heating power $P_q$ can be set by changing resistor arrangement $RM_q$. Heating power $P_q$ can also be varied by adjusting the voltage at voltage source $U_0$, it being the case, however, that the heating powers of the other optoelectronic components are also altered accordingly. The maximum amount of the power variation $\Delta P_q P_q = P_{q,max} - P_{q,min}$ of a channel q is defined by the magnitude of the voltage applied to contact fields $K_{q,v,w}$ and $K_{q,v,w}$, the dimensioning and arrangement of resistors $R_{q,ij \rightarrow q,k,l}$, and by short circuits between the contact fields, as well as by dimensionally sizing heating resistor $P_q$ of resistance heater $H_q$. This power variation $\Delta P_q$ results in a maximum wavelength variation $\Delta \lambda_{q,max}$.

A further possibility for setting the characteristic wavelength provides for setting heating power $P_q$ to a defined value $P \geq 0$ and for measuring the associated wavelength. Heating power $P_q$ is then changed on the basis of stored empirical values for the functional relationship $\lambda_q(P_q)$.

It is also conceivable to successively set heating power $P_q$ to two values and, each time, to measure the associated wavelength. The characteristic of functional relationship $\lambda_q(P_q)$ is subsequently calculated by interpolation and/or extrapolation of the previously determined wavelengths, and heating power $P_q$ is changed accordingly.

It is equally conceivable to vary heating power $P_q$ at intervals, in defined steps $\Delta P$, and to measure the corresponding wavelength to produce functional relationship $\lambda_q(P_q)$, and to vary heating power $P_q$ on the basis of the determined relationship.

It is, of course, also possible to continuously vary heating power $P_q$ until the desired characteristic wavelength is obtained.

When adjusting heating power $P_q$, the following requirement is met for the resistance values of connections LQ between voltage source $U_0$ and the matrix-like arrangement of contact fields $K_{q,i,j}$–$K_{q,k,l}$, as well as the internal resistance of voltage source $U_0$: if, given a component arrangement of n channels having n resistance heaters and n arrangements of contact fields, a number of n-1 resistance heaters H has a heating power $P_{e,min}$, and any resistance heater $H_s$ has heating power $P_s$, where $P_{s,min} < P_s < P_{s,max}$ and $s \neq e$, then electrical connections LQ of voltage source $U_0$ having the contact fields of individual channels q, as well as the internal resistance of voltage source $U_0$ are dimensionally designed such that, in response to a variation in the heating powers of n-1 channels by $\Delta P_e$, i.e., from $P_{e,min}$ to $P_{e,max}$, the heating power of resistance heater $H_s$ varies by a value $\Delta P_{s,error} < \epsilon_s \cdot \Delta P_s$, with a value $0 < \epsilon_s < 1$ which is freely selectable, but which should be as small as possible, to minimize the cross-influencing of the channels.

Figure 2B:
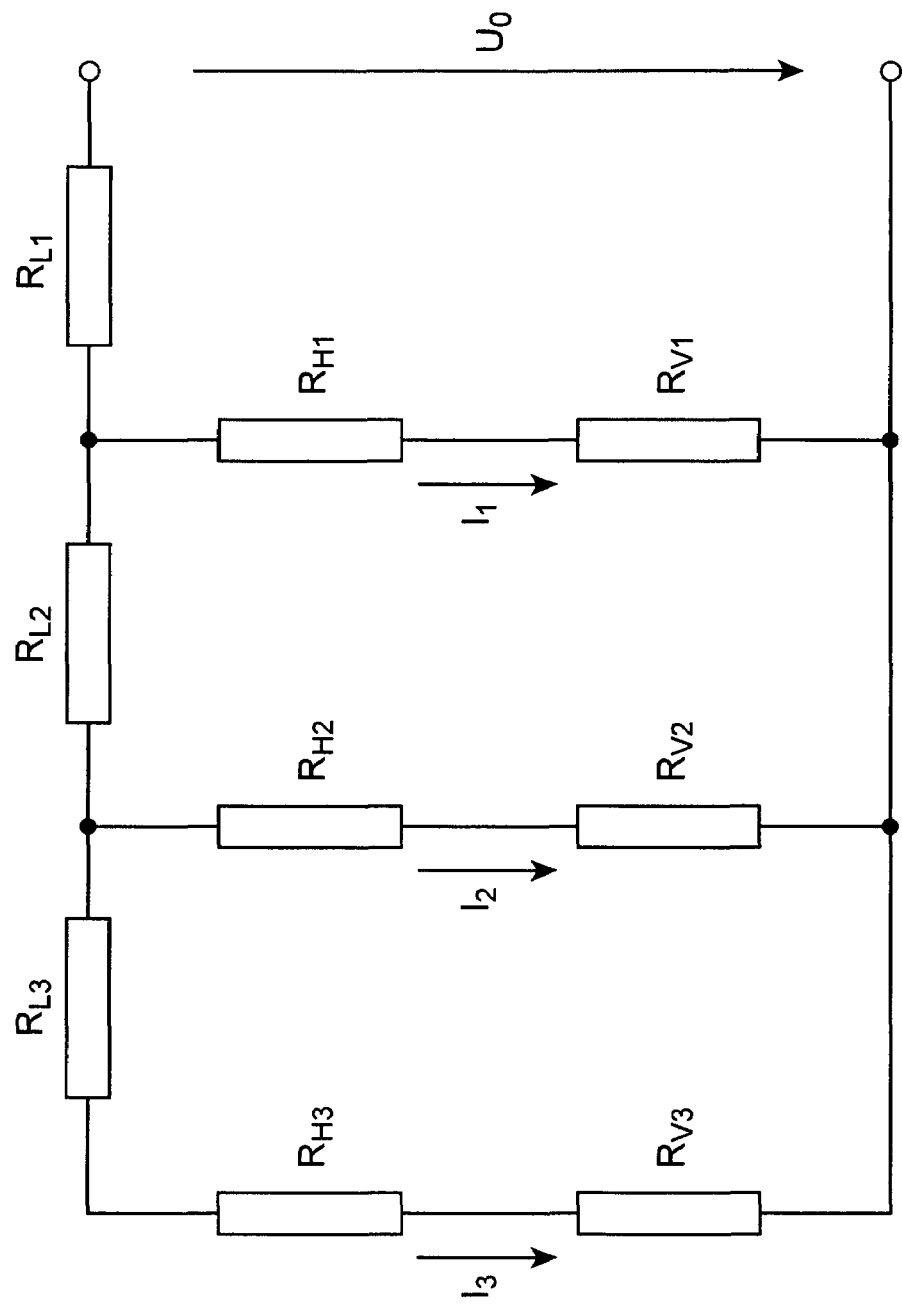
FIG. 2b shows a circuit diagram of the resistor apparatus.

FIG. 2b shows the circuit diagram of an embodiment of the present invention including three resistance heaters. In this simple case, the matrix-like arrangement of contact fields is such that they can be combined to form total resistances (referred to in the following as series resistors $P_{V1}$–$R_{V3}$) which can be connected in series with heating resistor $R_{H1}$–$R_{H3}$. Electrical connections LQ of voltage source $U_0$ to the contact fields leading to total resistors $R_{V1}$–$R_{V3}$ and heating resistors $R_{H1}$–$R_{H3}$ feature a line resistance $R_{L1}$–$R_{L3}$. The internal resistance of voltage source $U_0$ is contained in resistor $R_{L1}$.

Figure 2C:
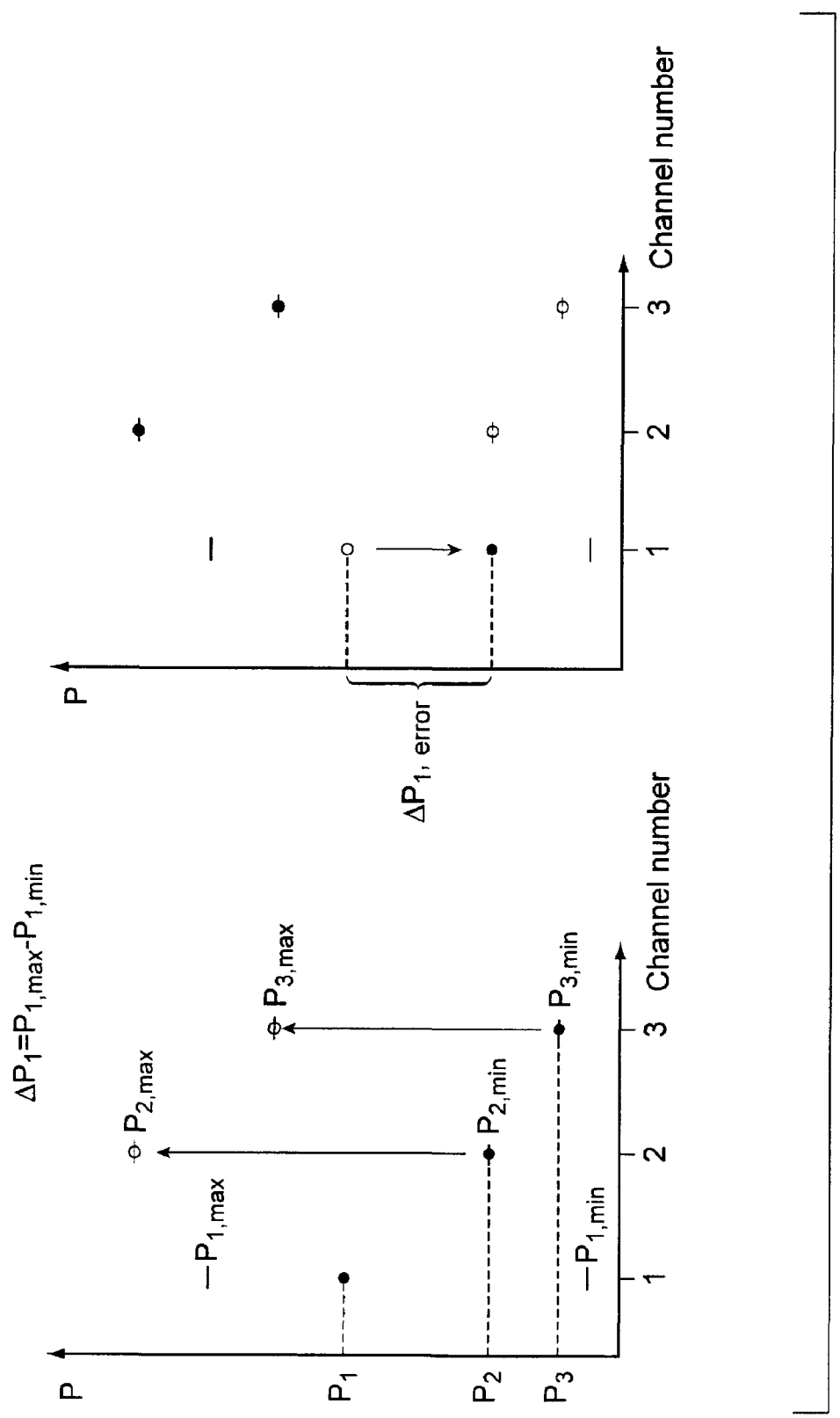
FIG. 2c shows graphs depicting how the heating powers of different channels influence each other.

The resistance values of series resistors $R_{V1}$–$R_{V3}$ and heating resistors $R_{H1}$–$R_{H3}$ are dimensioned according to required heating powers $P_1$–$P_3$ or wavelength shifts and the magnitude of available voltage $U_0$. Line resistances $R_{L1}$–$R_{L3}$ must meet the above requirement. The powers of heating resistors $R_{H1}$–$R_{H3}$ result from: $P_q = I^2_q R_{Hq}$ where q=1,2,3 and $R_{Hq}$ = resistance of the q-th heater $H_q$ and from the currents $$I_1 = \frac{U_o}{R_{tot}}\left(1 - \frac{R_{L1}}{R_{tot}}\right)$$

$$I_2 = \frac{U_o}{R_\beta}\left[1 - \frac{R_{L1}}{R_{tot}} - \frac{R_{L2}}{R_{tot}} + \frac{R_{L2}}{R_\gamma}\left(1 - \frac{R_{L1}}{R_{tot}}\right)\right]$$

$$I_3 = \frac{U_o}{R_\alpha + R_{L3}}\left[1 - \frac{R_{L1}}{R_{tot}} - \frac{R_{L2}}{R_{tot}} + \frac{R_{L2}}{R_\gamma}\left(1 - \frac{R_{L1}}{R_{tot}}\right)\right]$$

and
$R_\alpha = R_{1,3} + R_{V3} + R_{H3}$
$R_\beta = R_{V2} + R_{H2}$
$R_\gamma = R_{V1} + R_{H1}$
$R_{tot}$ = total resistance FIG. 2c shows the aforementioned requirement for channel 1. Heating power $P_1$ of channel 1 has any value within $\Delta P_1$. The remaining channels 2 and 3, respectively, have heating powers of $P_{2,min}$ and $P_{3,min}$. If the heating powers of channels 2 and 3 are raised to $P_{2,max}$ and $P_{3,max}$, the deviation from $P_1$, must be less than $\epsilon_1 \cdot \Delta P_1$.

The following briefly shows the calculation of the resistances $R_{L1}$ to $R_{L3}$:

$$\frac{\Delta P_{1,error}}{\Delta P_1} = \frac{P_1^{(min)}(R_{V1}, R_{L1}, R_{L2}, R_{L3}) - P_1^{(max)}(R_{V1}, R_{L1}, R_{L2}, R_{L3})}{\Delta P_1} < \varepsilon_1$$

for any $R_{V1}$ $$\frac{\Delta P_{2,error}}{\Delta P_2} = \frac{P_2^{(min)}(R_{V2}, R_{L1}, R_{L2}, R_{L3}) - P_2^{(max)}(R_{V2}, R_{L1}, R_{L2}, R_{L3})}{\Delta P_2} < \varepsilon_2$$

for any $R_{V2}$ $$\frac{\Delta P_{3,error}}{\Delta P_3} = \frac{P_3^{(min)}(R_{V3}, R_{L1}, R_{L2}, R_{L3}) - P_3^{(max)}(R_{V3}, R_{L1}, R_{L2}, R_{L3})}{\Delta P_3} < \varepsilon_2$$

for any $R_{V3}$ where
$P_q^{(min)}$: heating power of channel q, the remaining channels having a heating power $P = P_{s,min}$;
$P_q^{(max)}$: heating power of channel q, the remaining channels having a heating power $P = P_{s,max}$.

From the above three equations, it is possible to calculate the maximum values of line resistances $R_{L1}$, $R_{L2}$, $R_{L3}$.

FIGS. 3 to 11 each represents the realization of the above in a respective component arrangement, as described in detail in the following.

Figure 3:
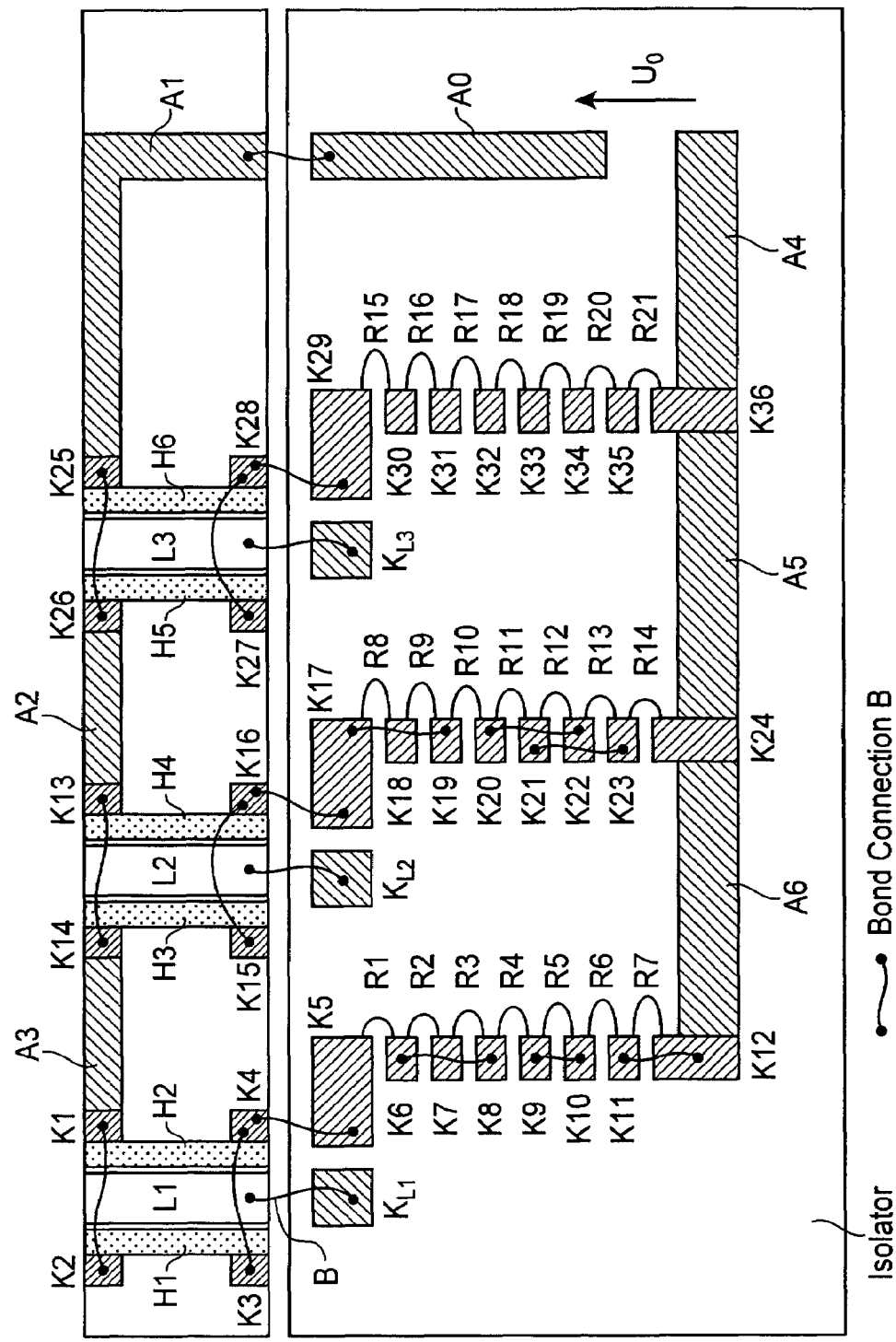
FIG. 3 shows a schematic diagram of a first embodiment of a component array.

FIG. 3 shows a component array 1 including three components, which may solid-state lasers L1, L2 and L3. The arrangement is divided into two parts, the three solid-state lasers L1 to L3 being disposed in the first part.

Furthermore, the first part of the arrangement includes resistance heaters H1 to H6, as well as a part of the contact fields of contact matrix (K1–K4; K13–K16; K25–K28), H1, H2 and K1–K4 belonging to channel 1, H3, H4 and K13–K16 being associated with channel 2, and H5, H6 as well as K25–K28 being assigned to channel 3. The resistance heaters H1–H6 are arranged such that they are in thermal contact with solid-state lasers L1 to L3 associated with them.

The second part of the arrangement includes an insulator on which is situated—for each channel, i.e., for each solid-state laser L1 to L3—the second part of the contact fields of contact matrix (K5 to K12 for channel 1, K17 through K24 for channel 2, and K29 through K36 for channel 3). In the present case, the contact matrix is a one-dimensional matrix having twelve fields. Leads LQ to voltage source $U_0$ are at the upper edge of the row of lasers and at the lower edge of the row of contacts. The leads include the following regions: A0, B, A1, K25, B, K26, A2, K13, B, K14, A3, K1, B, K2 as well as, on the insulators, A4, K36, A5, K24, A6, K12, B being bond connections.

Consequently, the leads contain regions of the contact matrices.

Situated next to the contact matrices on the contact arrangement are further contact fields $K_{L1}$ to $K_{L3}$, which are connected by electrically conducting bond connections B to the contacts of the rows of lasers L1–L3. Contact fields K5 to K12 of channel 1, K17 through K24 of channel 2, and K29 through K36 of channel 3 of the contact matrices are provided with an electrically conducting connection to resistors R1–R7; R8–R14 and R15–R21 by spatially distributed resistor arrangements. In FIG. 3 they are represented as black loops. Contact field K4 is electrically connected to contact field K5 by a bond connection. The same applies to contact fields K16 and K17, as well as K28 and K29. The supply voltage of the resistance heater is applied between regions A4 and A0, this being indicated by an arrow.

The resistance heaters H1–H6 are set to a defined heating power $P_q$ by changing the resistances between the contacts of the contact matrix, it also being possible to implement this by adding electrical connections or by changing the loop-shaped resistor arrangements.

The extent to which the heating power required during the tuning process varies is adjusted by a variable voltage at voltage source $U_0$.

Figure 4A:
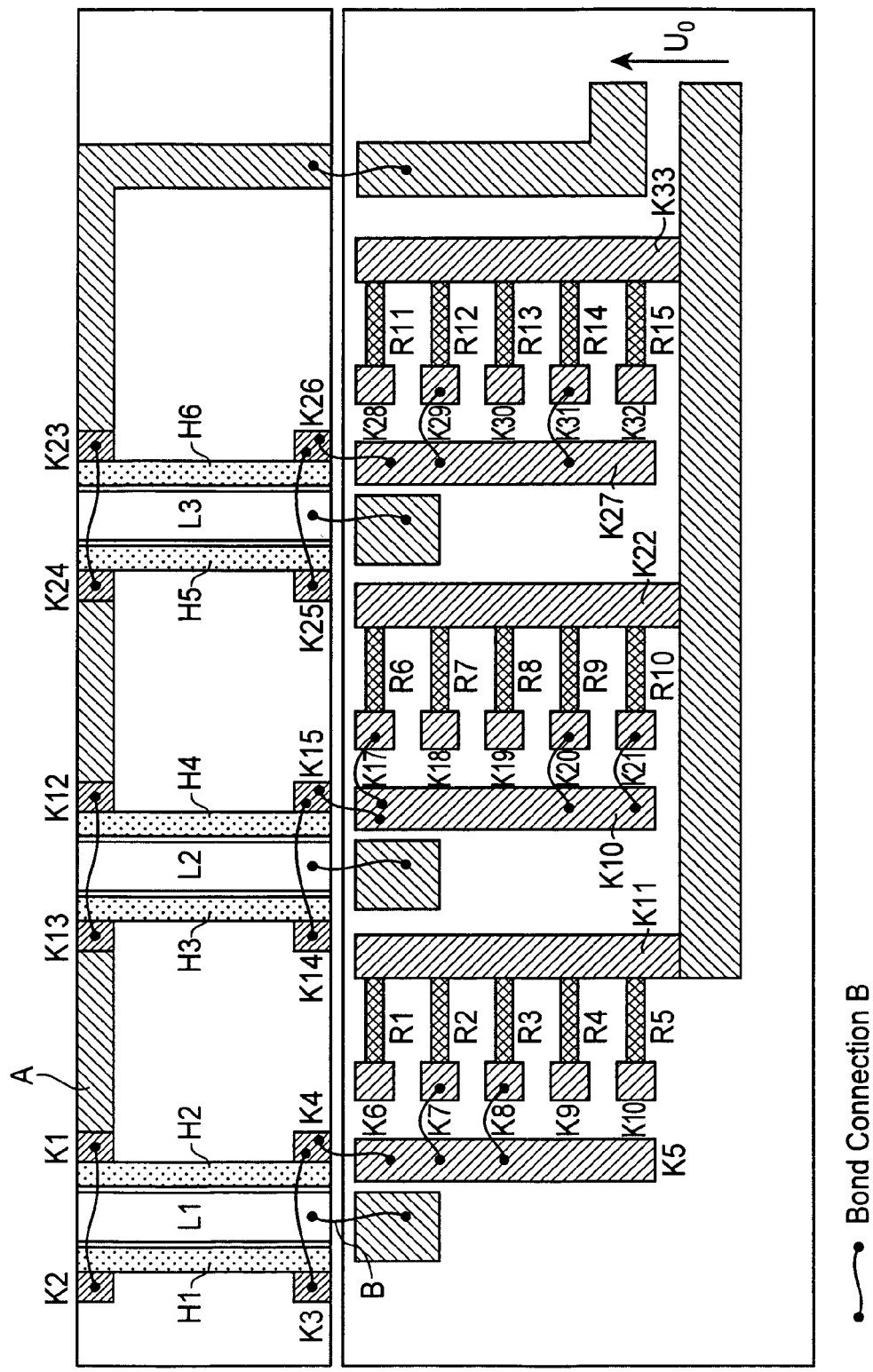
FIG. 4a shows a schematic diagram of embodiment of a component array.

The embodiment of the present shown in FIG. 4a is similar to the example in FIG. 3. It differs by the arrangement of the contact matrix, which, in this case, is made up of 11 contact fields (K1 through K11 for channel 1, K12 through K22 for channel 2, and K23 through K33 for channel 3). Located between contact fields K6 through K10 and contact fields K11, K17–K21 and K22, as well as K28–K32 and K33, are ohmic resistors having the values:

R1=R6=R11=$frax$;1;1·R,
R2=R7=R12=½·R,
R3=R8=R13=¼·R,
R4=R9=R14=⅛·R,
R5=R10=R15=$frax$;1;16·R, resistance R being defined by the maximum and minimum settable resistance.

Binary coding of the resistance values may be used, making it possible to span a resistance range from R to $R/2^i$, i being the number of resistors per channel. Thus, given five resistors, thirty-one different resistance values can be set. For example, for channel 1, electrically conducting connections are established from contact field K5 to contact fields K6 to K10. If, for example, resistance value ⅙·R is to be set for channel 1, then, as implemented in FIG. 4a at component L1, resistor R2=½·R and resistor R3=¼·R are connected in parallel. A resistance value of 1/25·R is set at component L2, and a resistance value of 1/10·R is set at component L3.

For the case that $U_0$=2.5 V, R=480 ohm and $R_H$=20 ohm, FIG. 4b shows the heating power characteristic on the left-hand ordinate axis as a function of the set index. The resistance value results as $R_{res}=R/_{index}$. The power is calculated according to:

$$P(R) = \frac{U_0^2}{(R_{res} + R_H)} R_H$$

$R_{res}$ being the resultant resistance.

The relative increment, or step size, is plotted on the right-hand ordinate axis in FIG. 4b. A relative increment of one corresponds to the increment of the linear relationship between the heating power and the set index. Good agreement with the linear characteristic can be obtained by dimensioning of heating resistors H1–H6, voltage $U_0$ and resistance R.

Figure 4C:
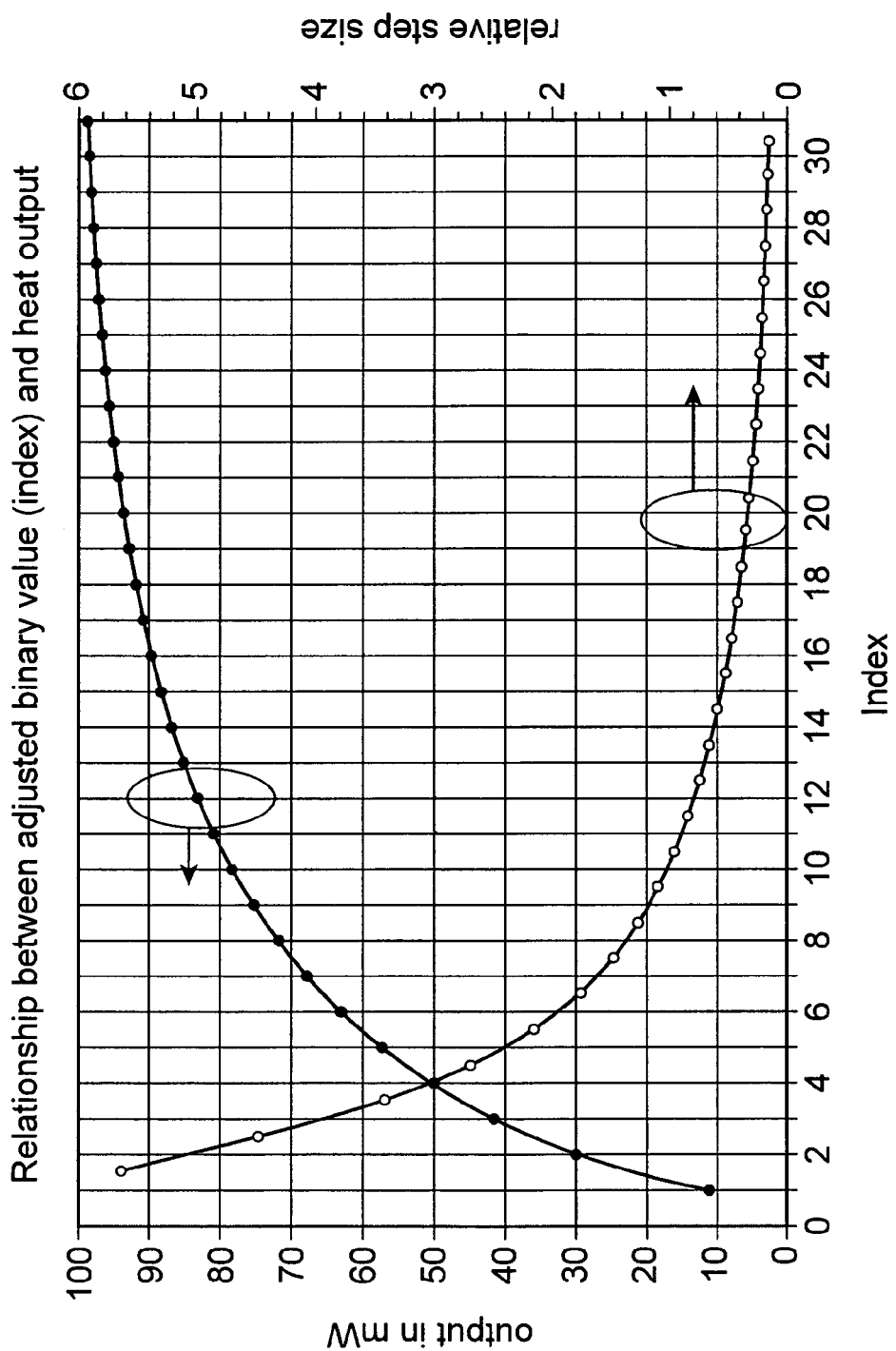
Figure 4D:
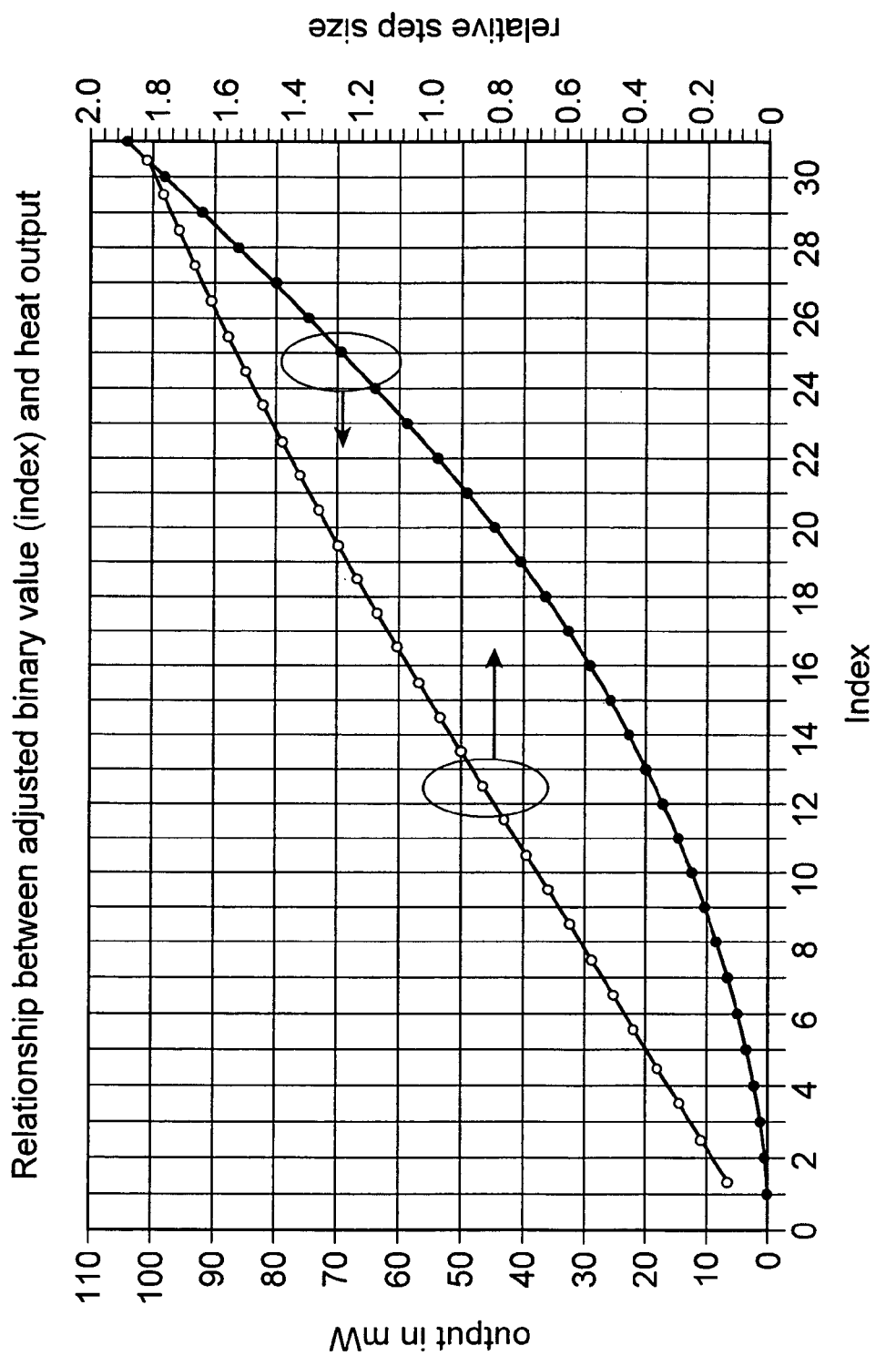

It may be advantageous, for high heating powers, for example, to adjust heating power $P_q$ in disproportionately small (large) increments, as is done in FIG. 4c (FIG. 4d), by selecting the supply voltage and the value for R, accordingly. For the case of large increments at high heating powers (FIG. 4d), the heating voltage is 20 V and the value of R=8 kohm. In the case of small increments at high heating powers, the heating voltage is 1.5 V and the value of R=40 ohm.

Figure 5A:
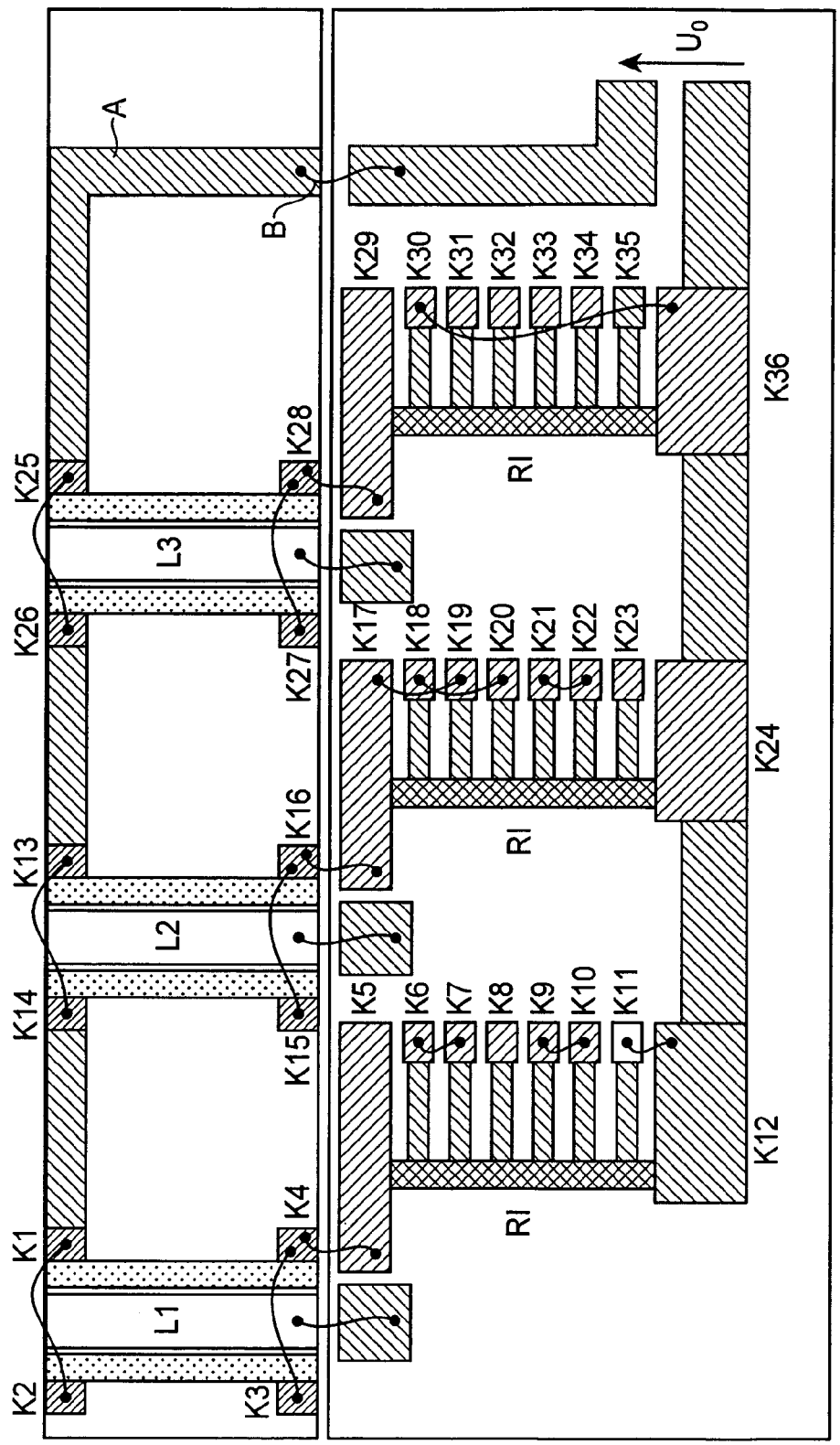
FIG. 5a shows a schematic diagram of another embodiment of a component array.

FIG. 5a shows a variation of FIG. 3. The loop-shaped resistor distributions in FIG. 3 are implemented as a straight resistor arrangement RI in FIG. 5a. For channel 1, for example, contact fields K5 to K12 pick off resistance RI at various points. Also, in this example, the resultant resistance values can be coded in a binary manner, provided that the resistances between two adjacent contact fields including K5 to K12 for channel 1, K17 to K24 for channel 2, and K29 to K36 for channel 3 are dimensioned, as shown by way of example for channel 1.

R1 = Resistance between K5 and K6 = R

R2 = Resistance between K6 and K7 = R·2

R3 = Resistance between K7 and K8 = R·4

R4 = Resistance between K8 and K9 = R·8

R5 = Resistance between K9 and K10 = R·16

R6 = Resistance between K10 and K11 = R·32

R7 = Resistance between K11 and K12 = R·64

For example, there is a resultant resistance of R1+R3+R4+R6 for solid-state laser L1. The same applies to the remaining channels.

Figure 5B:
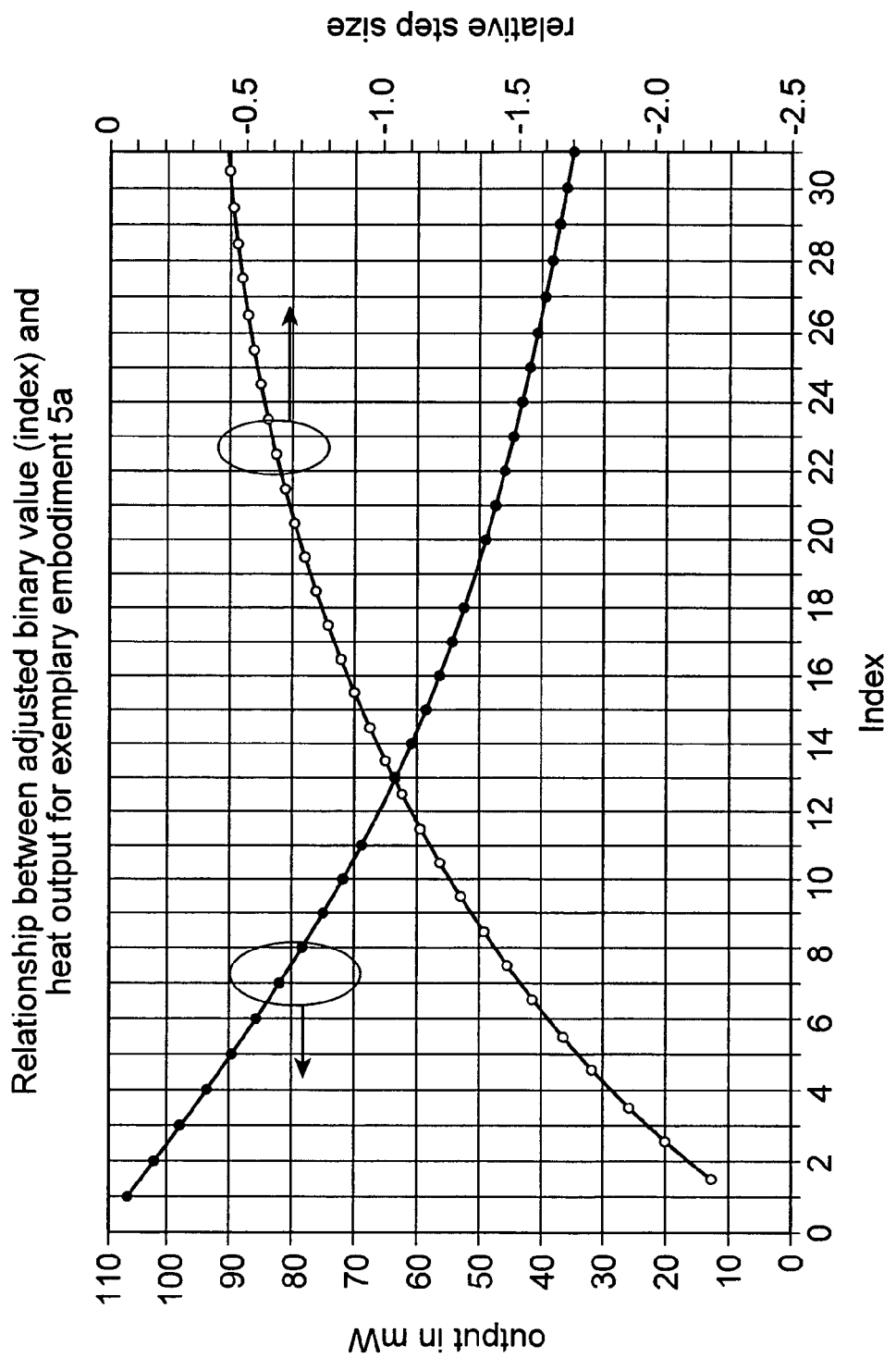
FIG. 5b shows a graph for calculating the heating power.

FIG. 5b shows the variation in power for the case of binary coding. With reference to channel 2, it is shown how it is possible to achieve further total resistance values with any combination of overlapping connections between the contact fields, for example through connections between contact fields K17 and K19, as well as K18 and K20.

Figure 6:
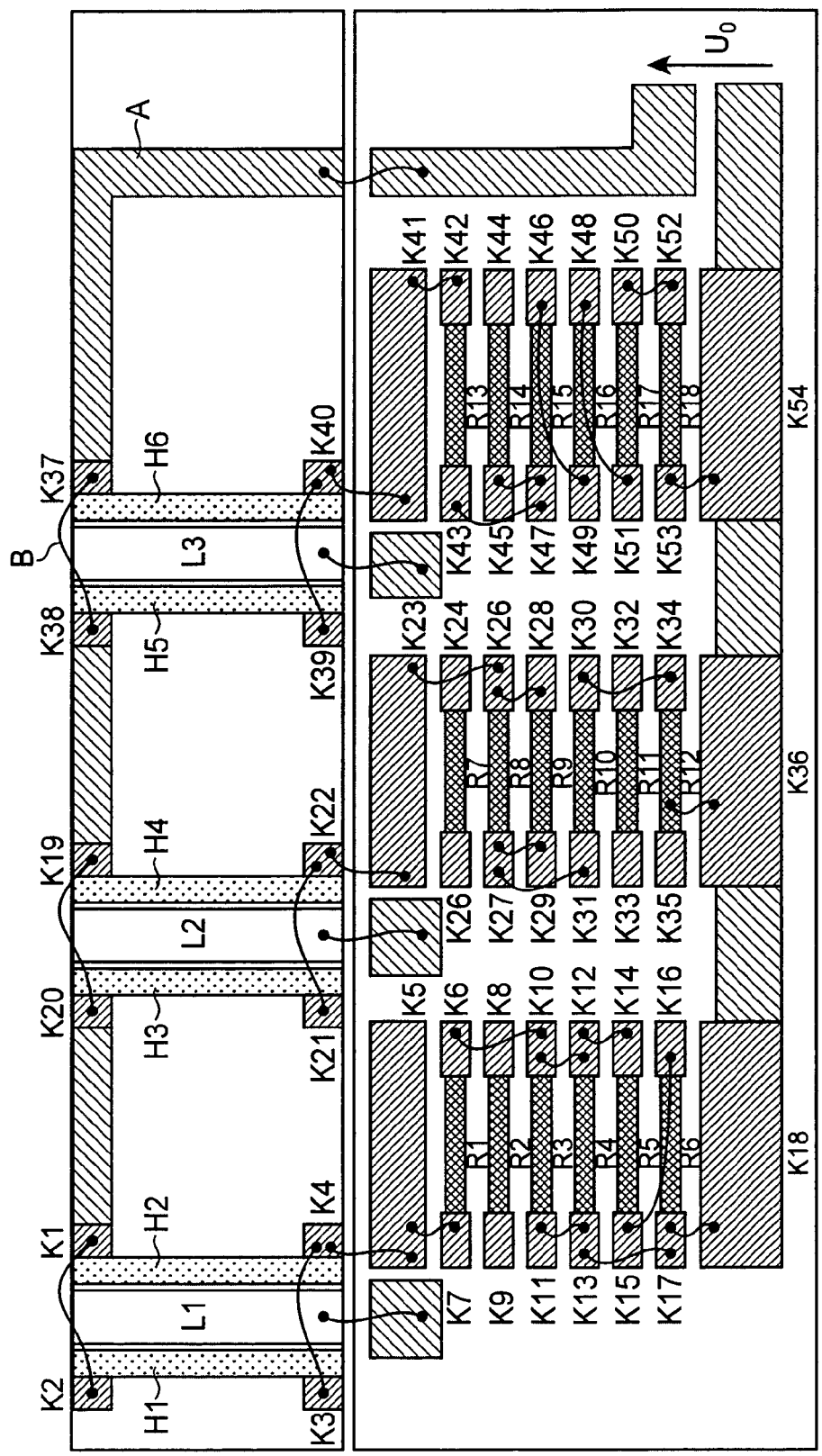
FIG. 6 shows a schematic diagram of another embodiment of a component array.

FIG. 6 shows a further embodiment of a component array of the present, six resistors being available per channel (R1 through R6 for channel 1; R7 through R12 for channel 2, and R13 through R18 for channel 3) for setting heating power $P_q$. By way of contact fields K5 to K18 (for channel 1 for example), the resistors can be interconnected, as needed, via bond connections B.

Figure 7:
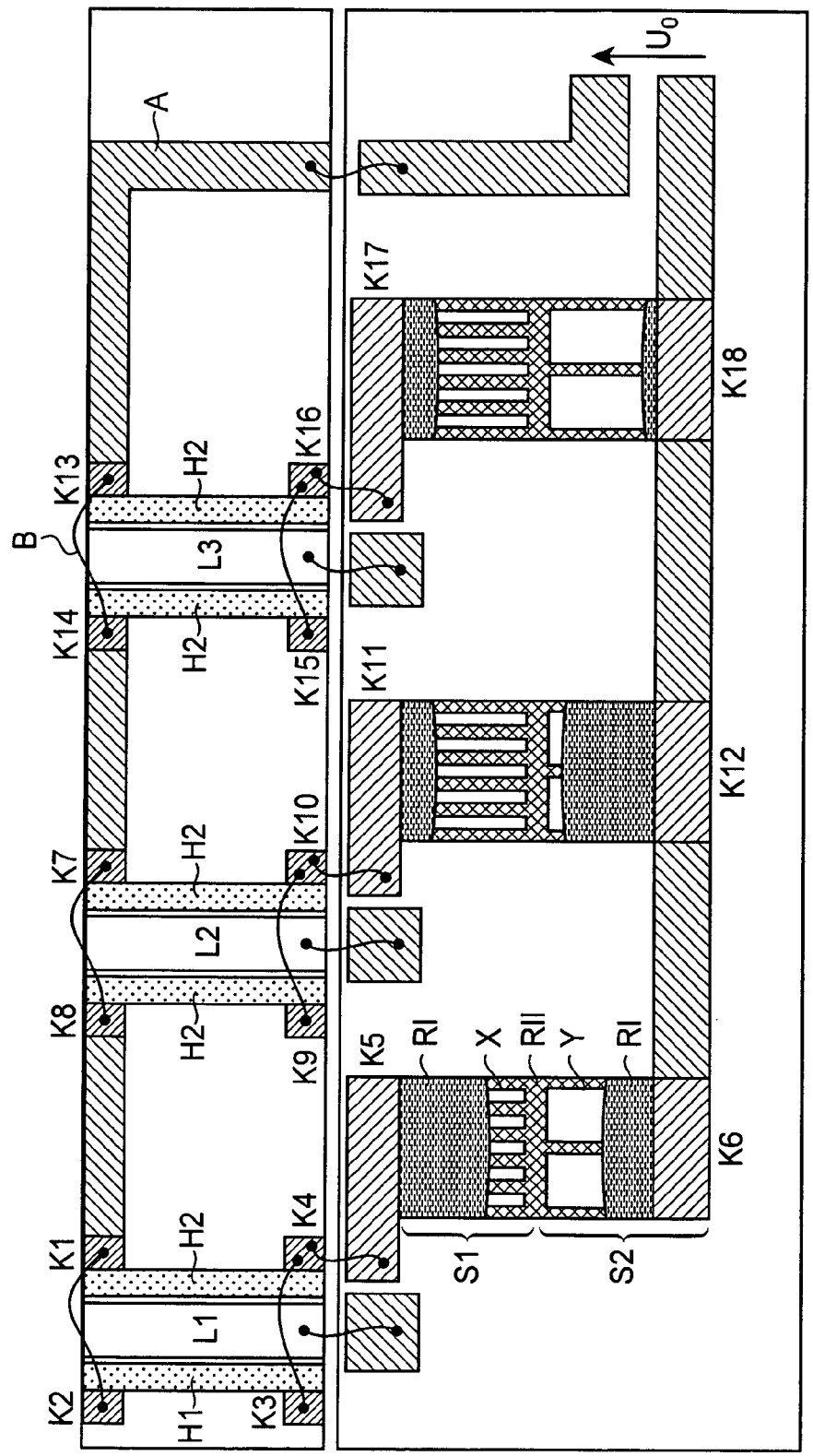
FIG. 7 shows a schematic diagram of another embodiment of a component array.

The contact matrix shown in FIG. 7 includes six contact fields per channel. Fields K5 and K6 (for channel 1) are electroconductively interconnected using a tunable resistor arrangement. The resistor arrangement is composed of two regions S1 and S2, which, in turn, include a region of electrically conducting material X (cross-hatching) and an insulating region having an insulator Y (white). The total resistance between the contact fields is reduced by applying a highly conductive material I (black), solder for example, to regions S1 and S2. Region S2 is used for the coarse setting of the heating power, and region S1 is used for the fine tuning of the heating power.

Figure 8:
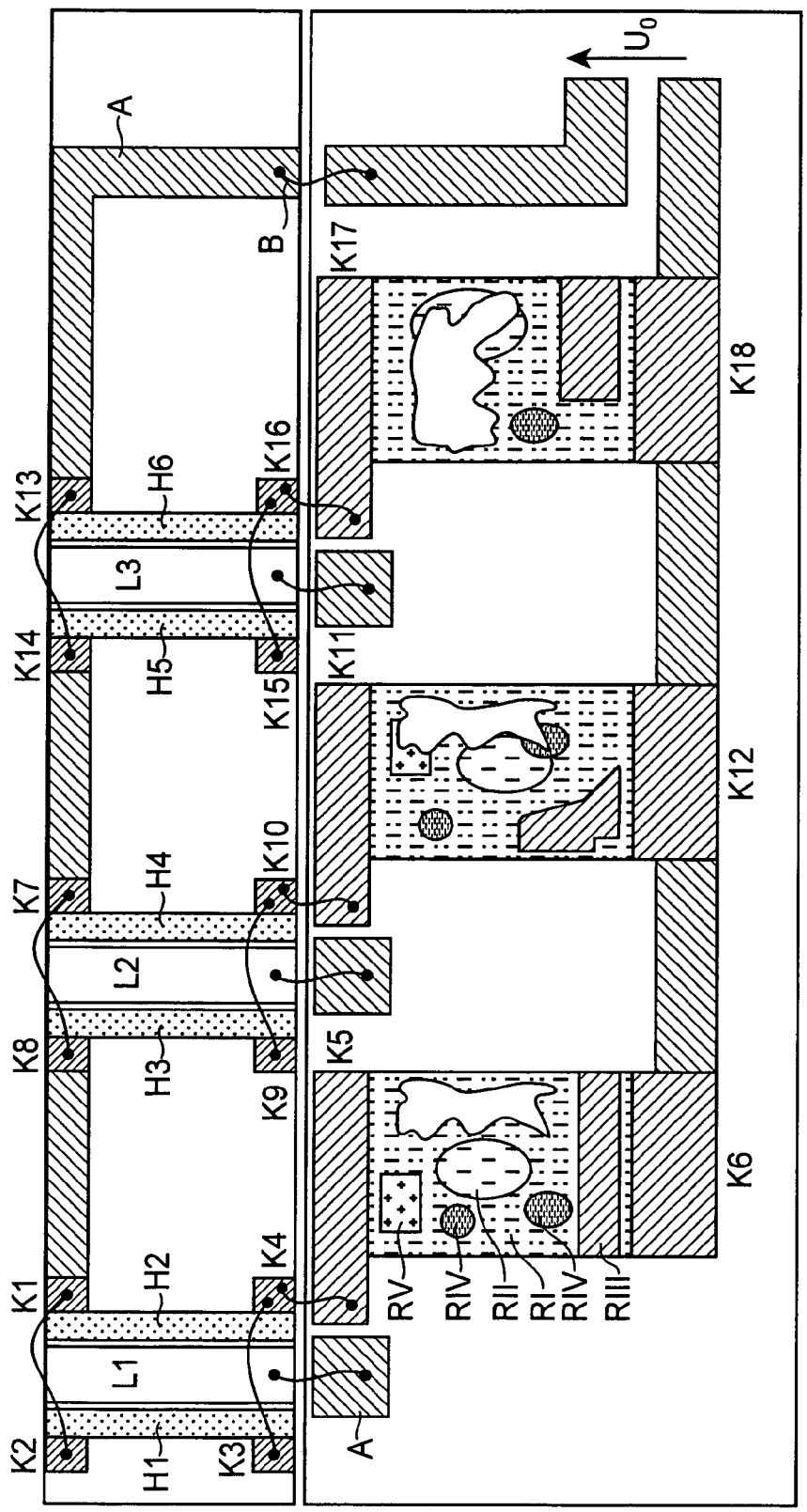
FIG. 8 shows a schematic diagram of another embodiment of a component array.

The embodiment of the present shown in FIG. 8 differs from that shown in FIG. 7, in that tuning is accomplished by changing the resistance of randomly shaped regions, shown as differently marked areas and having different electrical conductivities. These resistors RI–RV are made of different resistance materials. The resistance values of resistors RI–RV can be set to the desired resistance value, for example, by selectively changing the material, such as by removing or applying material. Laser ablation, for example, can be used to remove or apply material. Furthermore, the resistance value of resistors RI–RV can be modified by heat treatment, chemical treatment or electrochemical treatment. Other ways to alter the resistance value include influencing it by particle implantation, electromagnetic radiation or particle radiation, or by an electrical signal.

Figure 9:
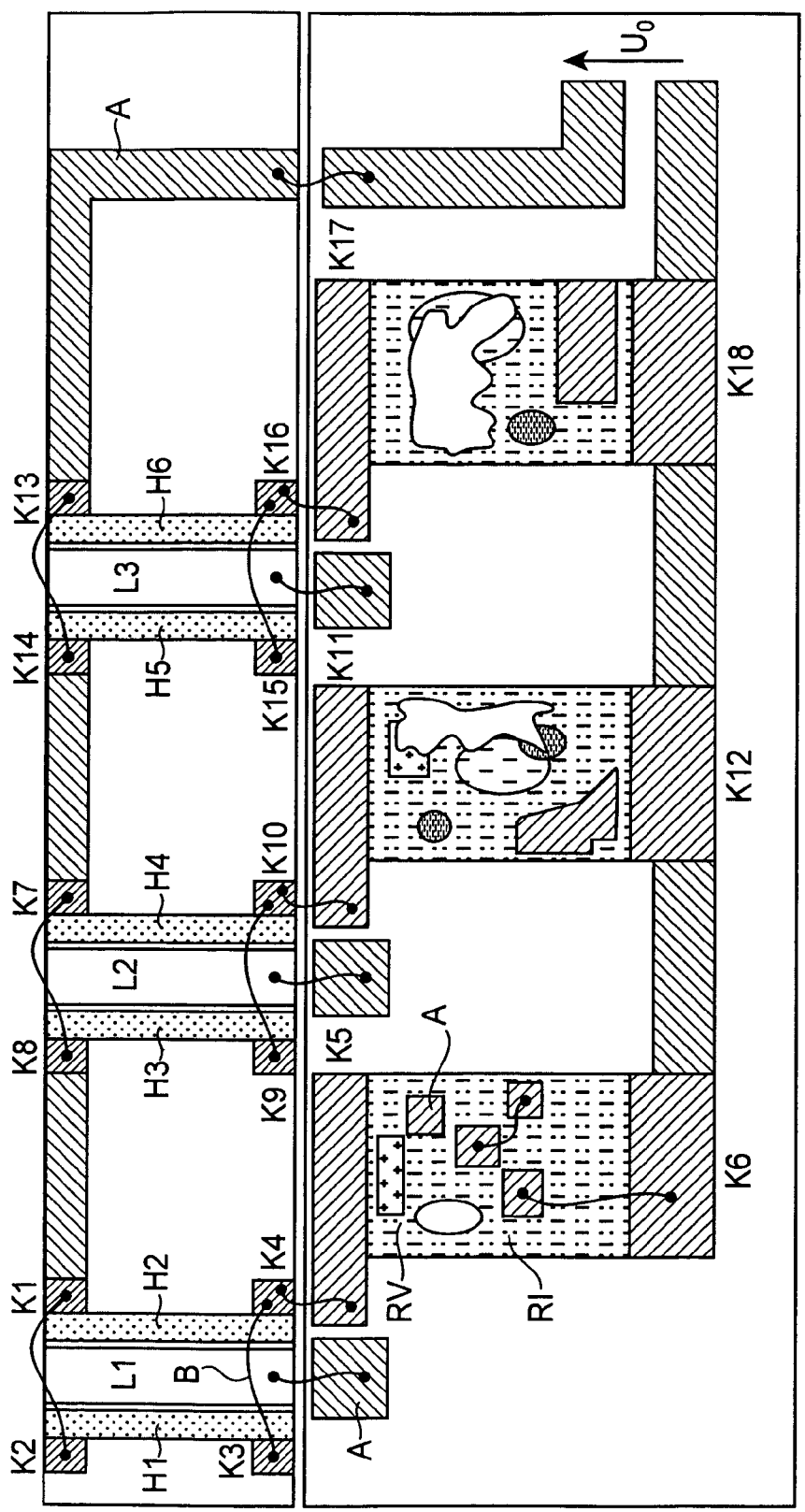
FIG. 9 shows a schematic diagram of embodiment of a component array.

The embodiment of the present shown in FIG. 9 differs from that shown in FIG. 8 in that any kinds of electrically conductive connections are applied between the randomly shaped resistors, the resistors being made of different resistance materials. The connections may be, for example, bond connections B. Tuning is accomplished by applying or removing bonds or, alternatively, using the method described in FIG. 8.

Figure 10:
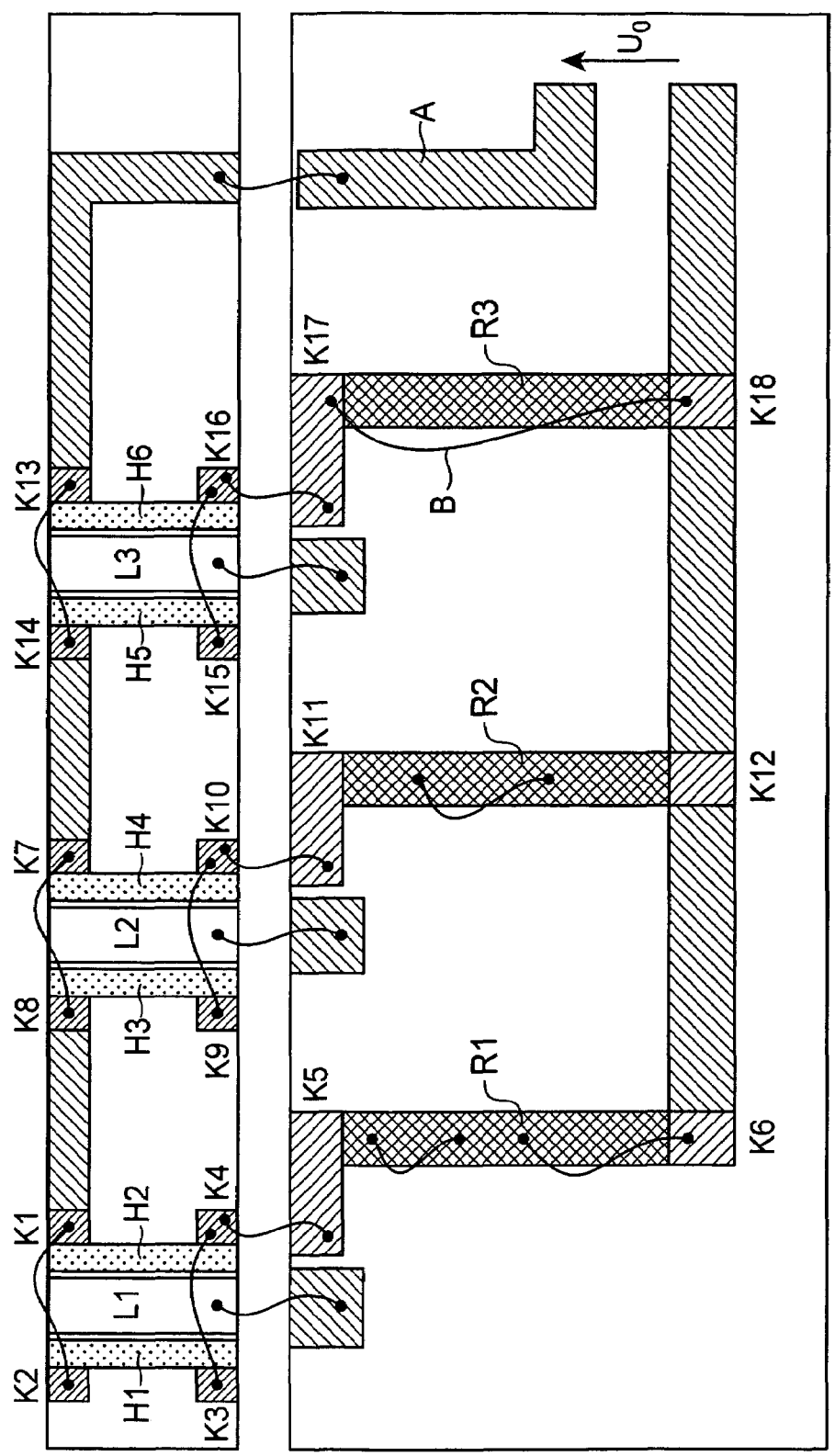
FIG. 10 shows a schematic diagram of embodiment of a component array.

In the embodiment of the present invention shown in FIG. 10, resistor arrangements RM for the three channels are formed by resistors R1 through R3. Tuning is carried out by applying electrically conductive connections, such as connections B, whose electrical conductivity is greater than resistor arrangement RM.

Figure 11:
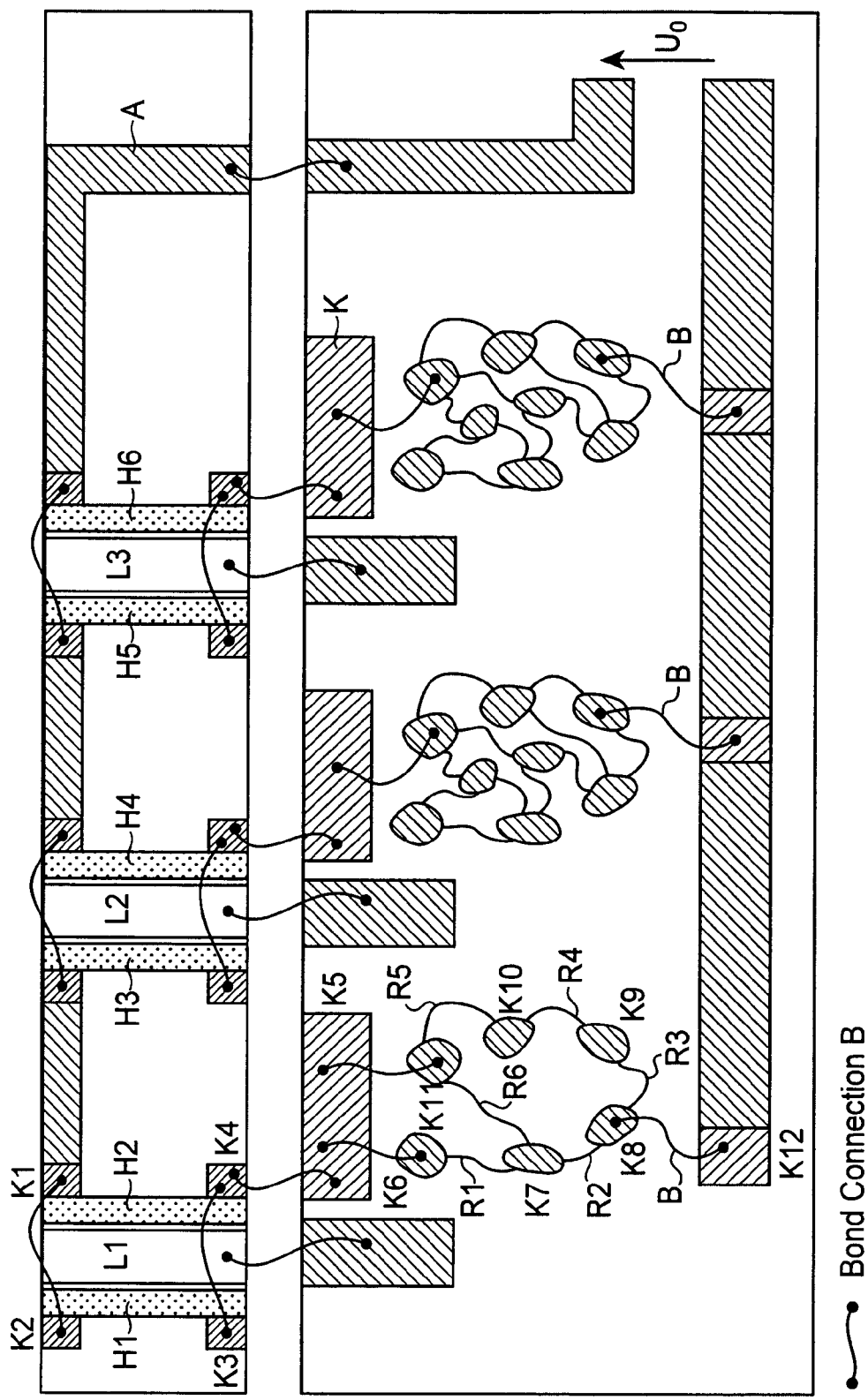
FIG. 11 shows a schematic diagram of embodiment of a component array.

FIG. 11 shows a further embodiment of the present invention in which the contact matrix for channel 1 includes contact fields K1 to K12. Between contact fields K6 and K11 are disposed electrically conducting connections R1 to R6 which are shown as curved lines in the drawing. The total resistance of the contact matrix is tuned using additional electrical connections, constituted as bond connections B.

Figure 12A:
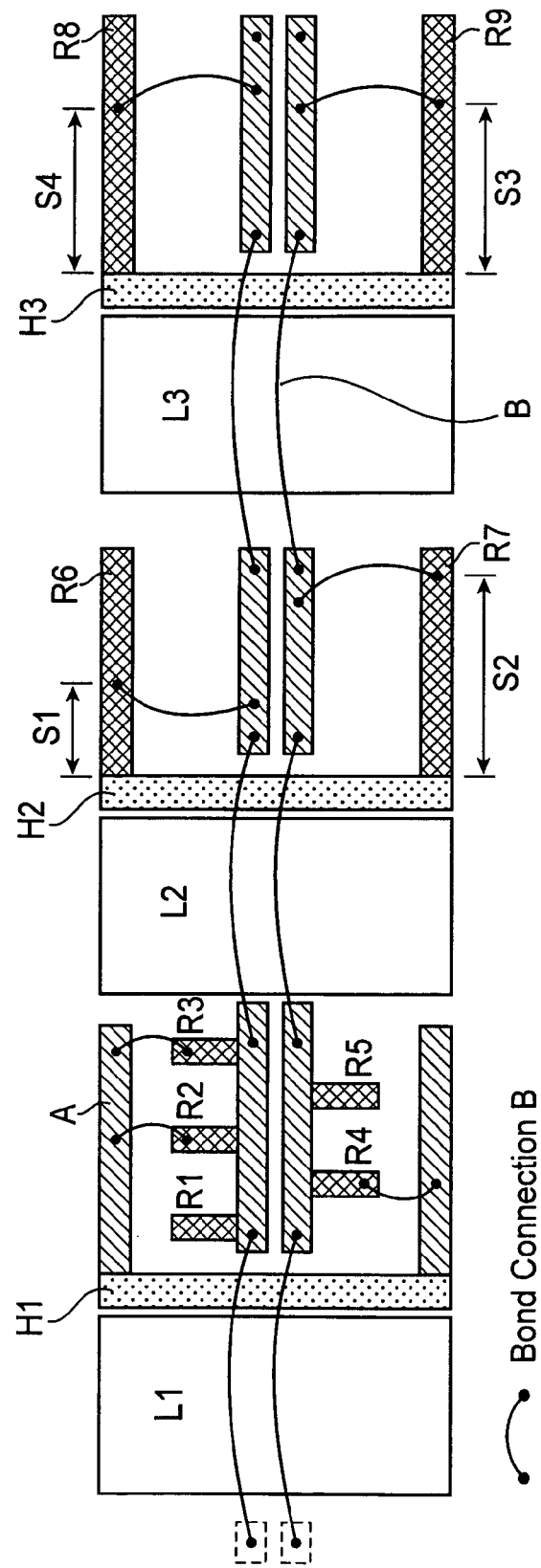
FIG. 12a shows a schematic diagram of an embodiment of a component having the resistor array on the row of components.

FIG. 12a depicts an embodiment of the present in which the resistors of resistor arrangement RM are disposed on the row of components, with the result that resistor arrangement RM is tuned on the row of components.

Figure 12B:
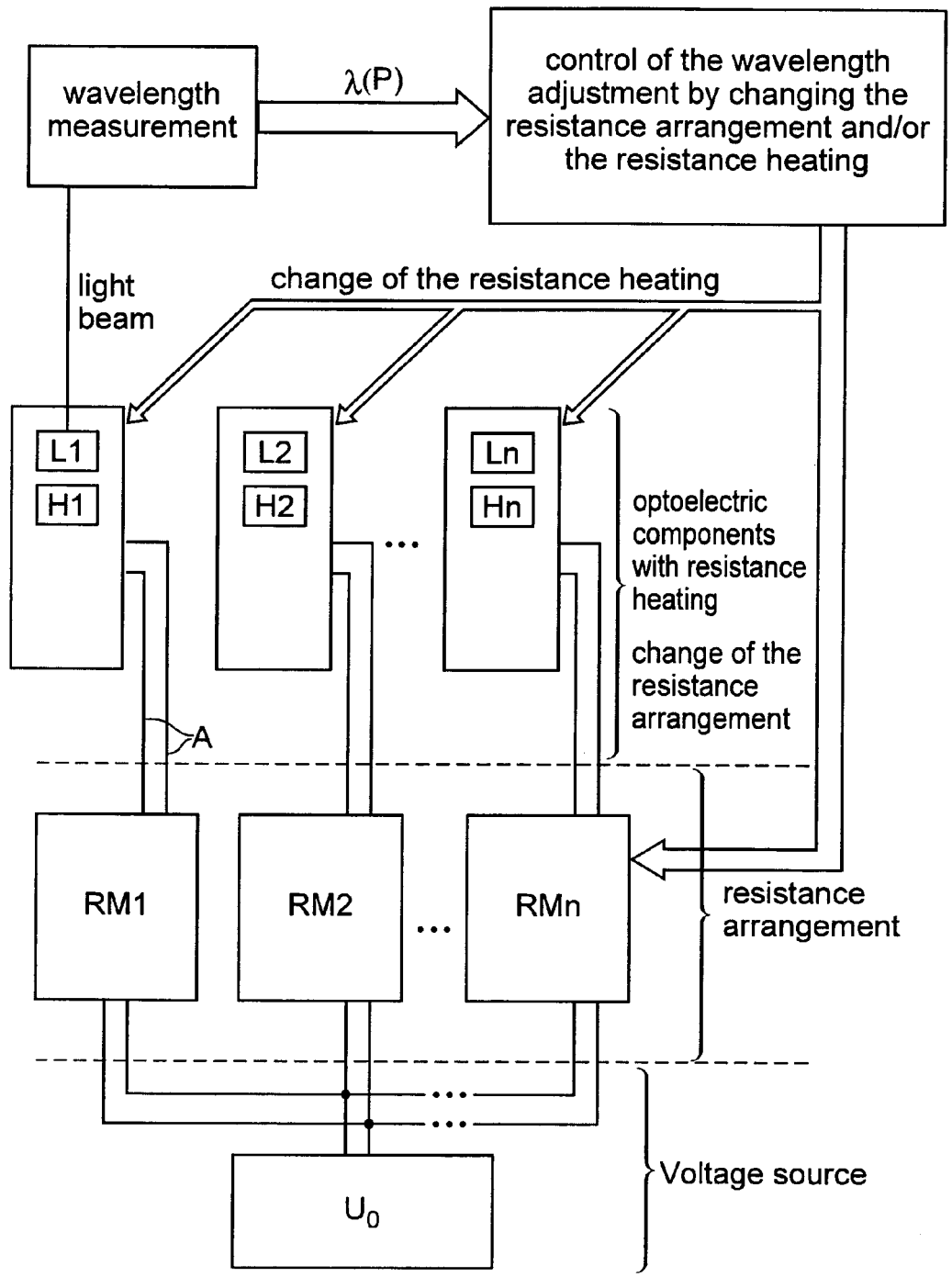
FIG. 12b shows a schematic illustrating a method for wavelength tuning in an optoelectronic component array.

At this point, the above-described method for tuning solid-state lasers Ll to Ln shall be briefly explained once again with reference to FIG. 12b. Thus, first of all, a defined heating power $P \geq 0$ is set individually for each solid-state laser Ll to Ln by resistor apparatus RMl through RMn or, alternatively, by voltage source $U_0$. Next, the wavelength is measured for each solid-state laser Ll through Ln. On the basis of functional relationship λ(P), the resistor arrangement associated with corresponding solid-state laser Ll–Ln is tuned. Depending on the process selected, these steps are carried out a number of times until, finally, the desired characteristic wavelength is obtained for each solid-state laser Ll–Ln.

It becomes clear from the aforementioned embodiment of the present that there is a multiplicity of possibilities for individually setting the heating powers $P_q$ of individual resistance heaters Hl–Hn in simple manner using resistor arrangement RMl–RMn according to the present invention, without having to revert to a plurality of voltage sources $U_0$. In particular, individual resistors Rl–Rn or RI–RV, etc., of resistor arrangements RMl–RMn can be changed at any time, even afterwards, following initial operation of the component array. Thus, it is conceivable, for example, to change the wavelength or heating power $P_q$ using time and temperature measurements on the basis of empirical values, in order, for example, to compensate for aging effects.

In addition, the present invention can be applied not only to the described solid-state lasers Ll–Ln, but in general to optoelectronic components, such as optical amplifiers, filters, wavelength multiplexers or waveguides.

Figure 13A:
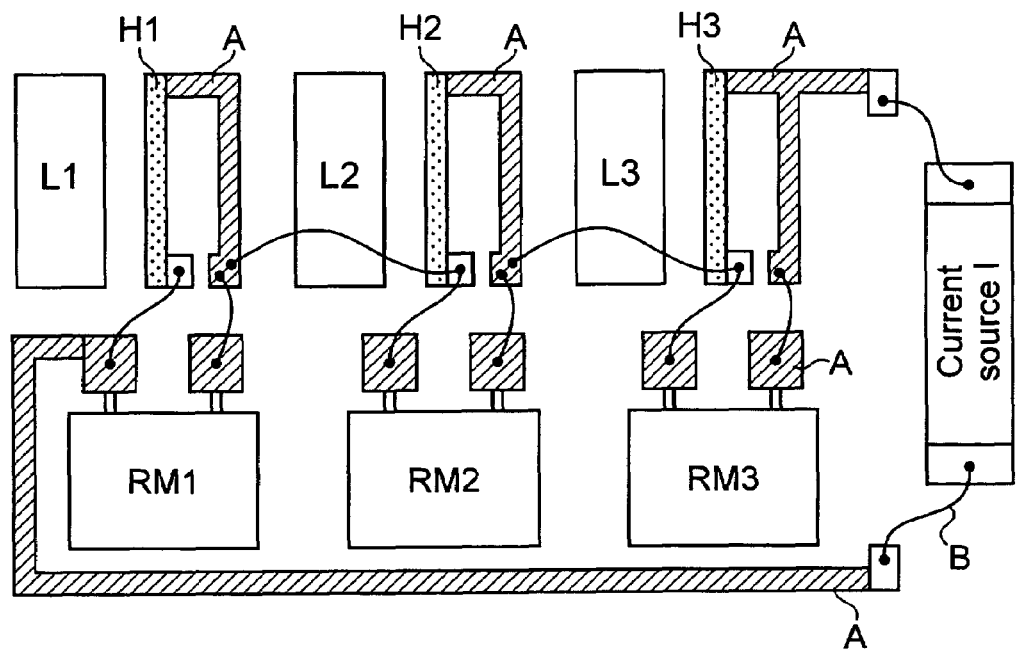
FIG. 13a shows a schematic diagram of an embodiment of a component array including a current source.
Figure 13B:
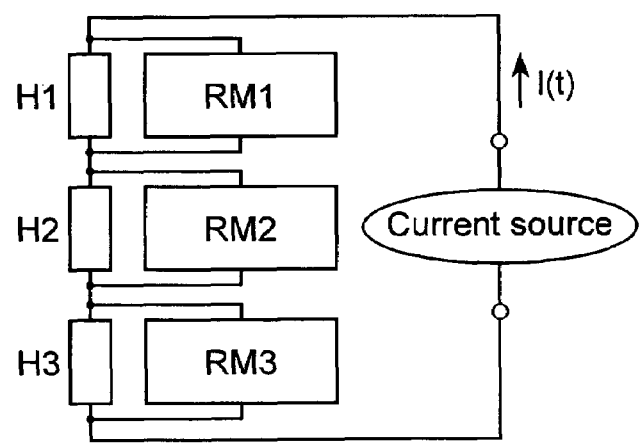

In the aforementioned embodiments of the present, a voltage source $U_0$ is used in each case as the energy supply apparatus. Of course, it is also possible to use a current source I, as shown in FIG. 13, resistor arrangement RMl–RMn and resistance heaters Hl–Hn being in parallel to each other, and not in series.

What is claimed is:

1. A method for the wavelength tuning of an optoelectronic component array, the optoelectronic component array including at least two optoelectronic components, the method comprising:
 comparing a respective measured wavelength of each of the at least two optoelectronic components with a respective desired characteristic wavelength so as to determine a respective wavelength deviation for each of the at least two optoelectronic components, the respective wavelength deviation being the difference between the respective measured wavelength and the respective desired characteristic wavelength of each optoelectronic component; and
 selectively setting a respective resistance value of a respective resistor arrangement connected between each of the at least two optoelectronic components and a respective resistance heater associated with each of the at least two optoelectronic components so as to achieve a respective thermal change of the respective resistance heater for setting the respective desired characteristic wavelength of each of the at least two optoelectronic components.

2. The method as recited in claim 1 wherein the selectively setting is performed using circuitry.

3. The method as recited in claim 1 wherein the selectively setting is performed by changing a respective material of a respective resistor arrangement.

4. The method as recited in claim 3 wherein the changing a respective material of the respective resistor arrangement is performed by removing or applying the respective material.

5. The method as recited in claim 1 wherein the selectively setting is performed using laser ablation.

6. The method as recited in claim 1 wherein the selectively setting is performed using heat treatment.

7. The method as recited in claim 1 wherein the selectively setting is performed using at least one of a chemical and an electrochemical treatment.

8. The method as recited in claim 1 wherein the selectively setting is performed using at least one of particle implantation, electromagnetic radiation and particle radiation.

9. The method as recited in claim 1 wherein the selectively setting is performed using an electrical signal.

10. The method as recited in claim 1 wherein the method is performed at regular intervals.

11. A device for the wavelength tuning of an optoelectronic component array having at least two optoelectronic components, the device comprising:
   a respective at least one resistance heater associated with each of the at least two optoelectronic components for setting a respective characteristic wavelength of the respective optoelectronic component;
   a common voltage or current source; and
   a respective resistor arrangement connected between each respective at least one resistance heater and the common voltage or current source, a respective total resistance of each respective resistor arrangement being variable so as to allow for wavelength tuning, the wavelength tuning being effected by changing the respective total resistance.

12. The device as recited in claim 11 wherein each respective resistor arrangement includes respective individual resistors disposed in a respective resistor array.

13. The device as recited in claim 11 wherein respective resistors of each respective resistor arrangement are connected between a respective contact fields disposed in rows, the respective resistors being arranged in a fixed order with regard to their respective resistance values, a respective total resistance of each respective resistor arrangement being achieved using the respective contact fields.

14. The device as recited in claim 13 wherein the respective total resistance of each respective resistor arrangement is achieved using bond connections.

15. The device as recited in claim 12 wherein respective resistors of each respective resistor arrangement are connected between respective contact fields disposed in respective rows, a respective resistors being arranged in a fixed order with regard to their respective resistance values, the respective total resistance of each respective resistor arrangement being achieved using the respective contact fields, and wherein the respective contact fields include a plurality of bond pads for attachment of electric leads.

16. The device as recited in claim 11 wherein respective resistors of the respective resistor arrangements include at least one of metal, non-metal, semiconductor material, liquid, gel, ceramic, oxide, metal-matrix compound, liquid crystals and polymers.

17. The device as recited in claim 11 wherein the at least two optoelectronic components are disposed on a first body and at least a portion of the respective resistor arrangements are disposed on at least one second body.

18. The device as recited in claim 17 wherein the first body includes semiconductor materials and the at least one second body includes an insulator.

19. The device as recited in claim 11 wherein each of the at least two optoelectronic components includes at least one of a solid-state laser, an optical amplifier, a filter, a wavelength multiplexer and a waveguide.

* * * * *